(12) United States Patent
Mochizuki et al.

(10) Patent No.: US 9,704,990 B1
(45) Date of Patent: Jul. 11, 2017

(54) VERTICAL FET WITH STRAINED CHANNEL

(71) Applicant: International Business Machines Corporation, Armonk, NY (US)

(72) Inventors: Shogo Mochizuki, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/269,180

(22) Filed: Sep. 19, 2016

(51) Int. Cl.
*H01L 29/78* (2006.01)
*H01L 29/66* (2006.01)
*H01L 21/02* (2006.01)
*H01L 29/49* (2006.01)
*H01L 21/308* (2006.01)
*H01L 29/165* (2006.01)
*H01L 27/088* (2006.01)
*H01L 21/8234* (2006.01)

(52) U.S. Cl.
CPC .... *H01L 29/7827* (2013.01); *H01L 21/02532* (2013.01); *H01L 21/3081* (2013.01); *H01L 21/823412* (2013.01); *H01L 21/823431* (2013.01); *H01L 21/823487* (2013.01); *H01L 27/088* (2013.01); *H01L 27/0886* (2013.01); *H01L 29/165* (2013.01); *H01L 29/495* (2013.01); *H01L 29/4916* (2013.01); *H01L 29/66545* (2013.01); *H01L 29/66666* (2013.01); *H01L 29/7855* (2013.01)

(58) Field of Classification Search
CPC ....... H01L 21/64; H01L 21/70; H01L 21/702; H01L 21/71; H01L 21/8232
See application file for complete search history.

(56) References Cited

U.S. PATENT DOCUMENTS

| 5,128,272 | A | 7/1992 | Ramde |
| 5,326,711 | A | 7/1994 | Malhi |
| 6,104,061 | A | 8/2000 | Forbes et al. |
| 6,150,210 | A | 11/2000 | Arnold |
| 6,194,773 | B1 | 2/2001 | Malhi |
| 7,560,728 | B2 | 7/2009 | Lin et al. |
| 7,749,842 | B2 | 7/2010 | Zhu et al. |

(Continued)

FOREIGN PATENT DOCUMENTS

| CA | 1271266 A1 | 7/1990 |
| WO | 02086904 A2 | 10/2002 |

(Continued)

*Primary Examiner* — Cheung Lee
(74) *Attorney, Agent, or Firm* — Cantor Colburn LLP; Vazken Alexanian

(57) ABSTRACT

A transistor in an integrated circuit device is formed using fabrication processes that include techniques to create a strain in the channel material, thereby improving the performance of the transistor. In one or more embodiments, an initial transistor structure is formed including a substrate, a dummy fin, and a hard mask. The dummy fin structure is narrowed. A channel is epitaxially grown on the dummy fin structure to create a strain on the channel. A first gate stack is formed over the channel. The hard mask and dummy fin are removed. A second gate stack is formed over the channel. Excess material is removed from the second gate stack. The formation of the transistor is finalized using a variety of techniques.

10 Claims, 8 Drawing Sheets

(56) References Cited

U.S. PATENT DOCUMENTS

| | | |
|---|---|---|
| 7,791,068 B2 | 9/2010 | Meng et al. |
| 7,915,685 B2 | 3/2011 | Cohen |
| 8,383,477 B2 | 2/2013 | Lee |
| 8,471,310 B2 | 6/2013 | Hynecek |
| 8,853,772 B2 | 10/2014 | Hebert |
| 8,952,420 B1 | 2/2015 | Loubet et al. |
| 9,048,329 B2 | 6/2015 | Kim et al. |
| 2003/0015755 A1 | 1/2003 | Hagemeyer |
| 2008/0197397 A1 | 8/2008 | Parthasarathy et al. |
| 2011/0006360 A1 | 1/2011 | Ikebuchi |
| 2012/0214285 A1 | 8/2012 | Guha et al. |
| 2015/0249153 A1 | 9/2015 | Morin et al. |
| 2015/0357432 A1 | 12/2015 | Lin et al. |
| 2015/0372140 A1 | 12/2015 | Liu et al. |

FOREIGN PATENT DOCUMENTS

| | | |
|---|---|---|
| WO | 2005091376 A1 | 9/2005 |
| WO | 2013123287 A1 | 8/2013 |

VERTICAL FET WITH STRAINED CHANNEL

BACKGROUND

The present invention relates in general to integrated circuit device structures and their fabrication. More specifically, the present invention relates to the fabrication of vertical field effect transistors with a strained channel.

Integrated circuit devices are a set of electronic circuits on one small chip of semiconductor material. A typical integrated circuit device includes many transistors. As feature sizes have become smaller, different types of transistor architectures have been developed. Among the newer types of transistor architectures is the fin-type field effect transistor (FinFET). A type of FinFET is the vertical FinFET, in which the current direction is vertical (normal to the substrate). It has been found that inducing strain in the channel of a transistor is useful to improve carrier mobility and device performance.

SUMMARY

Embodiments herein are directed to a method of forming a transistor in a semiconductor device. The method includes forming an initial transistor structure including a substrate, a dummy fin, and a hard mask. Thereafter, narrowing the dummy fin structure. A channel is epitaxially grown on the dummy fin structure in such a manner as to create a strain on the channel. A first gate stack is formed over the channel. The hard mask and dummy fin are removed. A second gate stack is formed over the channel. Excess material is removed from the second gate stack. The formation of the transistor is finalized using a variety of techniques.

Embodiments described herein are also directed to an integrated circuit device that includes at least one transistor. The integrated circuit device is formed by forming an initial transistor structure including a substrate, a dummy fin, and a hard mask. Thereafter, narrowing the dummy fin structure. A channel is epitaxially grown on the dummy fin structure in such a manner as to create a strain on the channel. A first gate stack is formed over the channel. The hard mask and dummy fin are removed. A second gate stack is formed over the channel. Excess material is removed from the second gate stack. The formation of the transistor is finalized using a variety of techniques.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
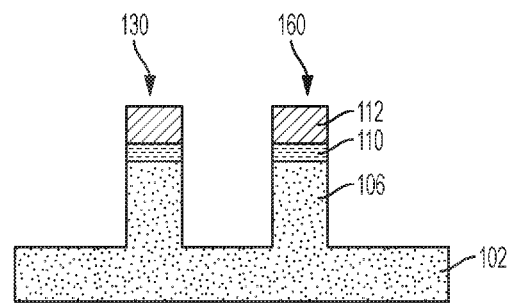
FIG. 1 depicts a side view of an exemplary initial structure.

It is understood in advance that although a detailed description of an exemplary transistor configuration is provided, implementation of the teachings recited herein are not limited to the particular structure described herein. Rather, embodiments of the present invention are capable of being implemented in conjunction with any other type of integrated circuit device, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well-known and so, in the interest of brevity, many conventional steps will only be mentioned briefly herein or will be omitted entirely without providing the well-known process details.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Described herein is a method of forming vertical field effect transistors (VFET) using strained channel techniques. VFETs are fin-type transistors in which the current travels in the vertical direction (normal to the substrate). This relatively new technology is becoming more popular as feature sizes become smaller because it allows the formation of smaller transistors.

Turning now to an overview of the present invention, one or more embodiments form transistors using strain techniques, such as forming the channel with compression or tension. In general, in a p-type FET, compressive strain improves mobility of the holes, allowing for better performance of the VFET. In an n-type VFET, it is tensile strain that improves mobility of the electrons, allowing for better performance of the VFET. Strained channel techniques can be used on the sidewall of the dummy fin. Achieving the strain on the channel can be accomplished through lattice mismatch of silicon and silicon germanium, which causes strain when they are deposited on each other.

Turning now to a more detailed description of an embodiment of the present invention, a preliminary fabrication methodology for forming VFETs with strained channels will now be described with reference to FIGS. 1 through 21.

Referring now to FIG. 1, an initial structure with two structures 130 and 160 is illustrated. These transistors 130 and 160 will be formed on a single substrate 102. It should be understood that the steps performed for transistor 130 will be the same as those performed for transistor 160. Atop the substrate is a hard mask used for the fin patterning. The hard mask can include an oxide 110 and a nitride 112. In some embodiments, the oxide 110 is a silicon oxide and the nitride 112 is a silicon nitride. In some embodiments, other materials can be used. The area of silicon between substrate 102 and oxide 110 can be referred to as dummy fin 106 (also sometimes referred to as a dummy gate). While two transistors are illustrated in the following figures, it should be understood that a typical integrated circuit device will contain millions of transistors.

Figure 2:
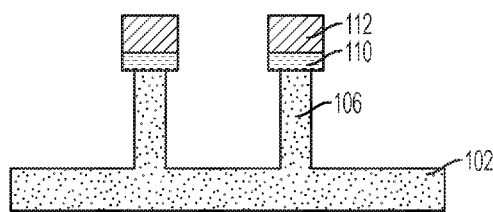
FIG. 2 depicts the structure after the dummy fin has been thinned.

Thereafter, the width dimension (the x-dimension, referring to legend 101) of fin 106 is reduced (or thinned) to create an undercut underneath oxide 110 and nitride 112. The reduction in width can be performed by one of a variety of different manners. In some embodiments, a dry etching or anisotropic etching is used to perform this step. The resulting structure is shown in FIG. 2.

Figure 3A:
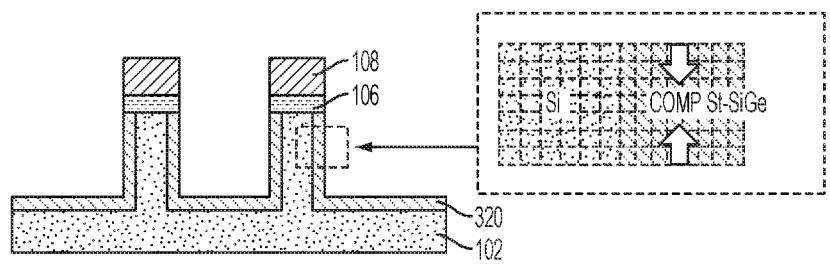
FIG. 3A depicts the structure after the epitaxial growth of a SiGe channel over an Si dummy fin.

Thereafter, there is an epitaxial growth of the channel. In some embodiments, there is an epitaxial growth of silicon germanium. This is illustrated in FIG. 3A, with layer 320 grown over substrate 102 and fin 106. Because silicon germanium has a larger lattice constant than silicon, the epitaxial growth of silicon germanium layer 320 on the silicon substrate 102 and silicon fin 106 results in compressive strain on the silicon germanium layer 320.

The above-described description applies to p-type field effect transistors (FETs). In an n-type FET, the fin 106 can be constructed of SiGe. In such a case, a layer of Si is epitaxially grown on the SiGe. Because of the difference in lattice constant, the epitaxial growth of silicon on the silicon germanium fin, the result is a tensile strain on the silicon layer. This is illustrated in FIG. 3B.

Figure 4:
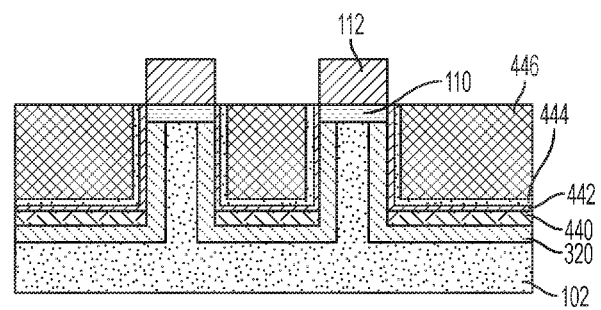
FIG. 4 depicts the structure after the formation of the gate stack.

After the deposition of the strained channel is the formation of the bottom spacer and the gate stack. The result is shown in FIG. 4. Bottom spacer 440 is deposited over the silicon germanium layer 320. Atop is a high-k material 442. Many different types of material can be used as the high-k material. In some embodiments, a hafnium-based material can be used, such as hafnium silicate and hafnium dioxide. A work function metal 444 is above the high-k material 442. Atop that is a gate material 446. In some embodiments, gate material 446 can be constructed of tungsten-based material or a polysilicon material. Other materials can also be used for gate material 446.

Figure 3B:
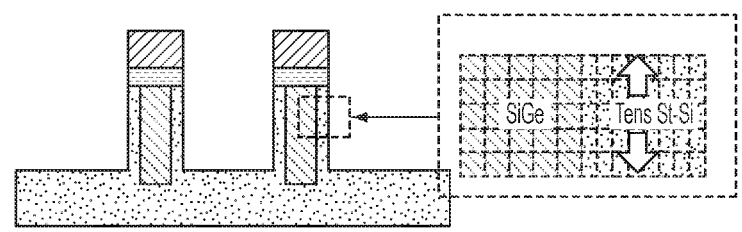
FIG. 3B depicts the structure after the epitaxial growth of a Si channel over an SiGe dummy fin.

While FIG. 4 is shown as being based off of the structure shown in FIG. 3A, it should be understood that the above description (and all following descriptions) also can apply to the structure of FIG. 3B, which depicts the n-type FET in which the fin 106 is silicon germanium.

Figure 5:
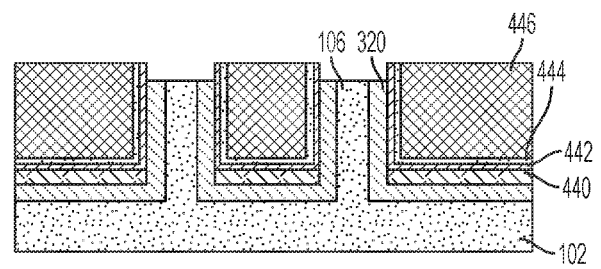
FIG. 5 depicts a structure after the removal of the hard mask layers.

Thereafter follows the removal of the hard mask layers, with the result shown in FIG. 5. As seen by comparing FIG. 5 with FIG. 4, oxide 110 and nitride 112 are removed using one of a variety of different techniques known in the art.

Figure 6:
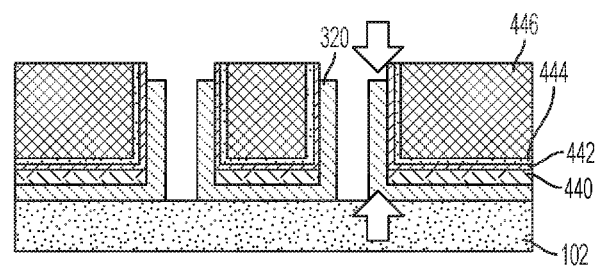
FIG. 6 depicts a structure after the removal of the dummy fin.

Thereafter, the fin 106 is removed using a selective etch technique. The result is shown in FIG. 6. The strain in silicon germanium layer 320 remains. Thus, in comparison to a normal silicon germanium deposition (without a fin 106), there is compressive strain in the silicon germanium layer 320.

Figure 7:
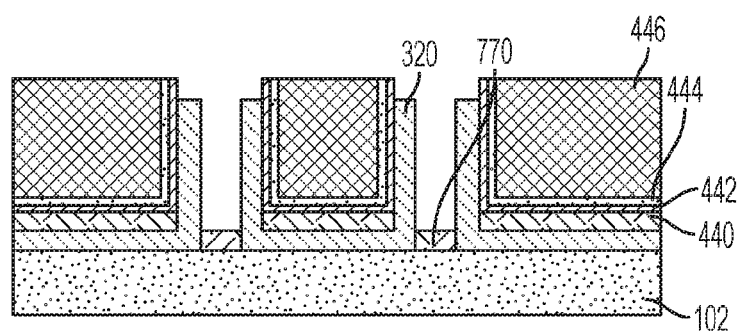
FIG. 7 depicts a structure after the deposition of a bottom spacer.

Thereafter, the construction of a transistor proceeds. A bottom spacer 770 is deposited. The resulting structure is shown in FIG. 7. Bottom spacer 770 can be formed from a nitride, such as silicon nitride or any other type of nitride commonly used in semiconductor formation, such as SiBCN or SiOCN.

Figure 8:
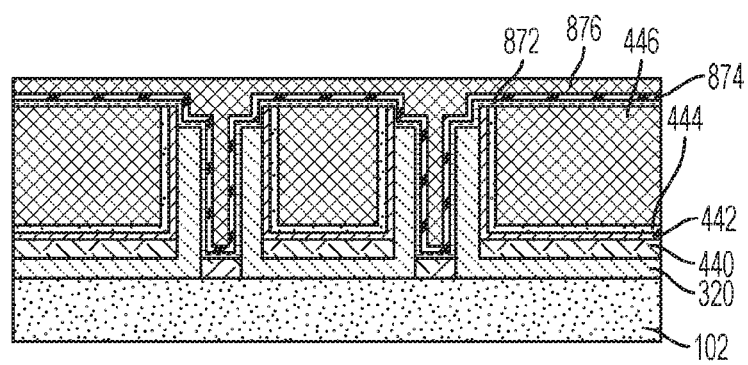
FIG. 8 depicts a structure after the deposition of a second gate stack.

The second gate stack is formed, with the resulting structure shown in FIG. 8. Present can be high-k dielectric 872, a work function metal 874, and a gate 876. Gate 876 can be constructed from a material such as tungsten or a polysilicon.

Figure 9:
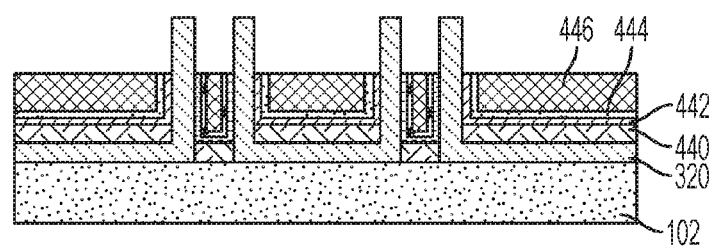
FIG. 9 depicts a structure after an etch back of the second gate stack.

Thereafter follows a gate stack etch back, removing materials except for the silicon germanium 320. The etch can be a dry etch technique. The resulting structure is illustrated in FIG. 9. The result is that the area formerly occupied by a dummy gate structure now has the actual gate material (e.g., high-k dielectric 872, work function metal 874, and a gate 876).

Figure 10:
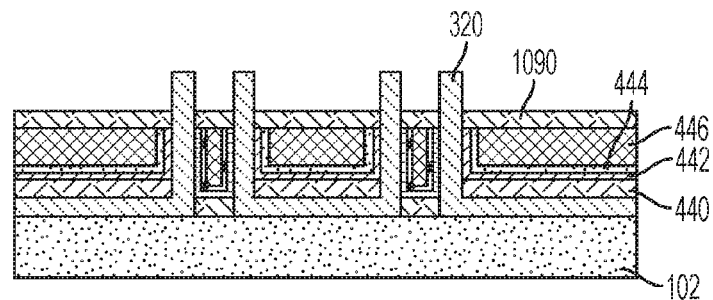
FIG. 10 depicts a structure after the formation of a top spacer.

Thereafter follows the formation of the spacer 1090. This can be a nitride, such as SiN, SiBCN, SiOCN. Conventional formation steps can then be used to finalize the formation of transistors in the integrated circuit device. The resulting structure is shown in FIG. 10.

Figure 11:
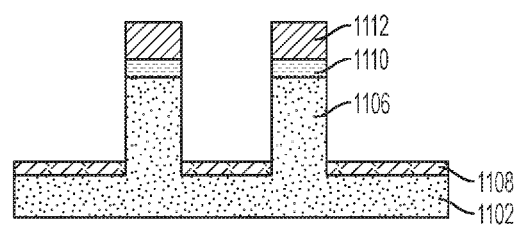
FIG. 11 depicts a side view of an exemplary initial structure.

Referring back to FIGS. 1 through 3A, there is shown there is a dummy fin 106, followed by the thinning of the dummy fin 106, followed by the growth of the strained silicon germanium channel 320. There is an alternative construction shown in FIGS. 11 through 13. In FIG. 11, there is a substrate 1102, a fin 1106, and a hard mask including an oxide 1110 and a nitride 1112. Overlaying substrate 1102 is a bottom spacer 1108. The bottom spacer 1108 can be a nitride, such as SiN, SiBCN, SiOCN, and the like. Thus, a primary difference between FIG. 11 and FIG. 1 is the presence of bottom spacer 1108.

Figure 12:
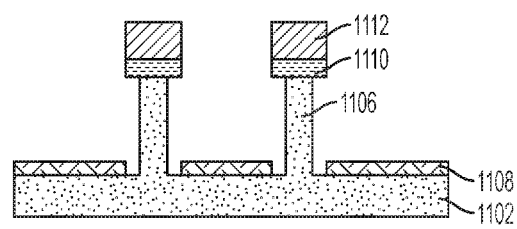
FIG. 12 depicts the structure after the dummy fin has been thinned.

Thereafter, with the result being shown in FIG. 12, there is a lateral etch of the fin 1106. In some embodiments, a dry etching or anisotropic etching is used to perform the thinning. Thereafter, there is a deposition of the silicon germanium layer 1320, with the result being shown in FIG. 13. Epitaxial growth of silicon germanium does not occur on nitride 1112 or bottom spacer 1108. Therefore, the only growth of silicon germanium occurs on fin 1106. Due to the lattice mismatch of silicon and silicon germanium, there is a strain in the silicon germanium.

Figure 13:
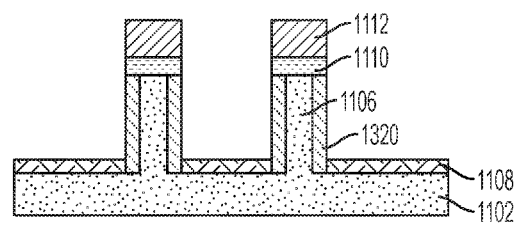
FIG. 13 depicts the structure after the epitaxial growth of an SiGe channel over an Si dummy fin.

Processing of the structure continues from FIG. 13 in a manner similar to that described above.

Figure 14:
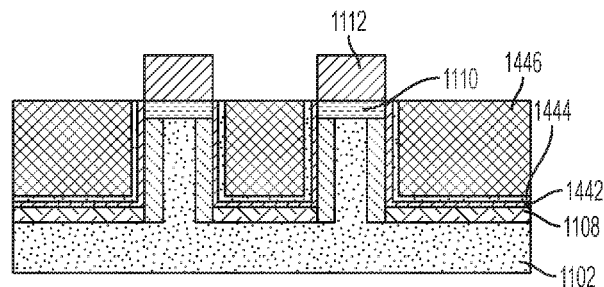
FIG. 14 depicts the structure after the formation of the gate stack.

After the deposition of the strained channel is the formation of the bottom spacer and the gate stack. The result is shown in FIG. 14. Atop bottom spacer 1108 is a high-k material 1442. A work function metal 1444 is above the high-k material 1442. Atop that is a gate material 1446. In some embodiments, gate material 1446 can be constructed of tungsten or a polysilicon material. Other materials also can be used for gate material 1446.

Figure 15:
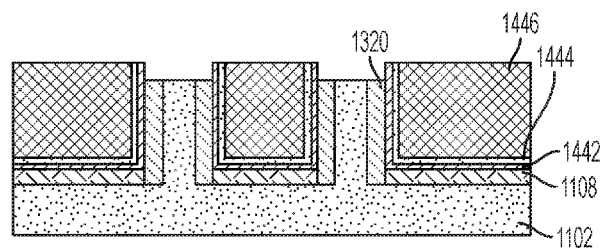
FIG. 15 depicts a structure after the removal of the hard mask layers.

Thereafter follows the removal of the hard mask layers, with the result shown in FIG. 15. As seen by comparing FIG. 15 with FIG. 14, oxide 1110 and nitride 1112 are removed using one of a variety of different techniques known in the art.

Figure 16:
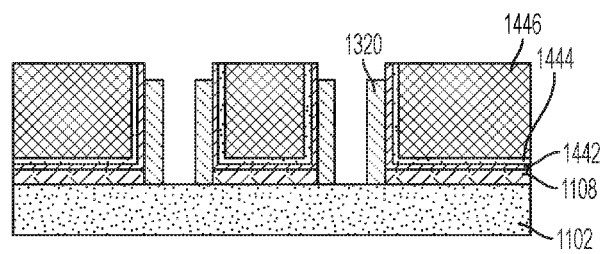
FIG. 16 depicts a structure after the removal of the dummy fin.

Thereafter, the fin 1106 is removed using a selective etch technique. The result is shown in FIG. 16. The strain in silicon germanium layer 1320 remains. Thus, in comparison to a normal silicon germanium deposition (without a fin 1106), there is compressive strain in the silicon germanium layer 1320.

Figure 17:
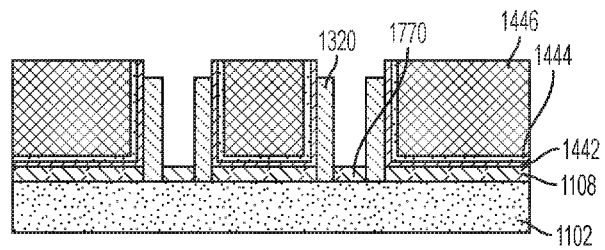
FIG. 17 depicts a structure after the deposition of a bottom spacer.

Thereafter, the construction of a transistor proceeds. A bottom spacer 1770 is deposited. The resulting structure is shown in FIG. 17. Bottom spacer 1770 can be formed from a nitride, such as silicon nitride or any other type of nitride commonly used in semiconductor formation, such as SiBCN or SiOCN.

Figure 18:
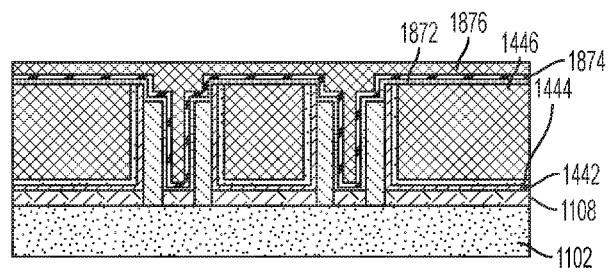
FIG. 18 depicts a structure after the deposition of a second gate stack.

The second gate stack is formed, with the resulting structure shown in FIG. 18. Present can be high-k dielectric 1872, a work function metal 1874, and a gate 1876. Gate 1876 can be constructed from a material such as tungsten or a polysilicon.

Figure 19:
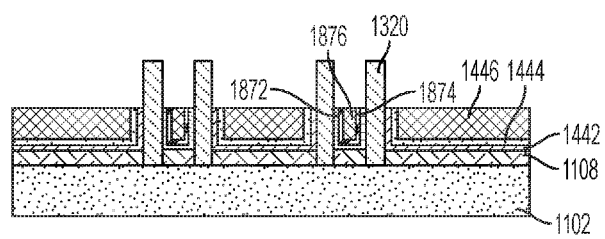
FIG. 19 depicts a structure after an etch back of the second gate stack.
Figure 20:
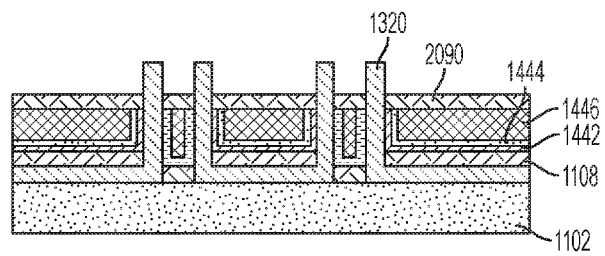
FIG. 20 depicts a structure after the formation of a top spacer.

Thereafter follows a gate stack etch back, removing materials except for the silicon germanium 1320. The etch can be a dry etch technique. The resulting structure is illustrated in FIG. 19. The result is that the area formerly occupied by a dummy gate structure now has the actual gate material (e.g., high-k dielectric 1872, work function metal 1874, and a gate 1876).

Thereafter follows the formation of the spacer 2090. This can be a nitride, such as SiN, SiBCN, SiOCN. Conventional formation steps can then be used to finalize the creation of transistors in the integrated circuit device.

Figure 21:
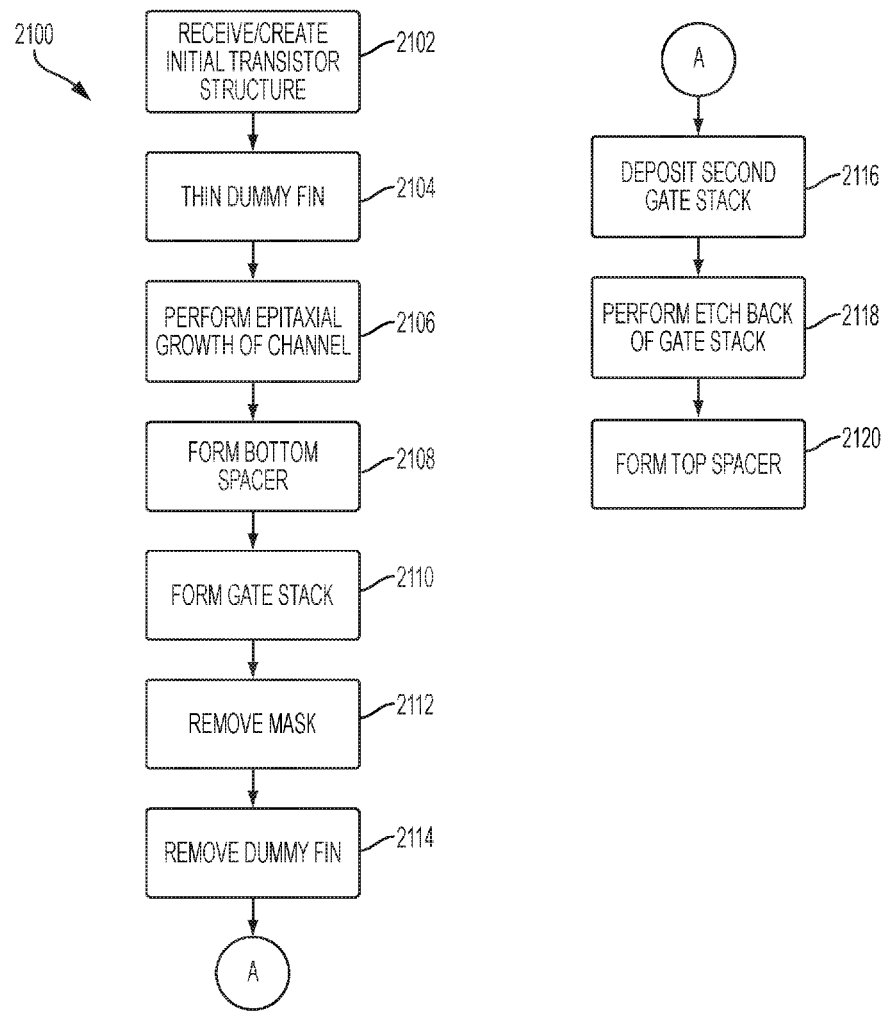
FIG. 21 depicts a flow diagram illustrating a methodology according to one or more embodiments.

FIG. 21 is a flow diagram illustrating a methodology 2100 according to one or more embodiments. At block 2102, an initial transistor structure is provided or created. A typical transistor structure will include a substrate, a dummy fin structure, and a hard mask. At block 2104, the dummy fin structure is etched down to make it narrower. At block 2106, an epitaxial growth of the channel is performed. This epitaxial growth can be of silicon germanium on a silicon dummy fin for a p-type FET. For an n-type FET, this can be of silicon on a silicon germanium dummy fin. Such a growth (of silicon germanium on silicon or of silicon on silicon germanium) results in a strain on the channel material due to the mismatch of the lattice constants of the materials, resulting in better performance of the channel. At block 2108, the bottom spacer is formed over the channel. In some embodiments, the bottom spacer can be placed before block 2106. Thereafter, the gate stack is formed (block 2110). The gate stack can include a high-k material, a work function metal, and a gate material, such as a polysilicon or tungsten. The hard mask is removed (block 2112), followed by the removal of the dummy fin (block 2114). Although the hard mask is removed, the channel material is still strained. Another spacer followed by a gate stack is deposited (block 2116). This can include a bottom spacer, a high-k dielectric, a work function metal, and a gate material, such as a polysilicon or tungsten. A gate stack etch back is performed to remove excess gate material (block 2118), followed by the formation of a top spacer (block 2120). From here, traditional semiconductor processing steps can be performed to produce transistors on an integrated circuit device.

Thus, it can be seen from the forgoing detailed description and accompanying illustrations that embodiments of the present invention provide structures and methodologies for providing transistors with strained channels, offering improved performance in fin-type FETs.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There can be many variations to this diagram or the operations described therein without departing from the spirit of the invention. For instance, the operations can be performed in a differing order or operations can be added, deleted or modified. All of these variations are considered a part of the claimed invention.

While various embodiments have been described, it will be understood that those skilled in the art, both now and in the future, can make various modifications which fall within the scope of the claims which follow. These claims should be construed to maintain the proper protection for the invention first described.

What is claimed is:

1. A method of forming a transistor in an integrated circuit device, the method comprising:
    forming an initial transistor structure including a substrate, a dummy fin, and a hard mask;
    reducing a width dimension of the dummy fin structure;
    epitaxially growing a channel on the dummy fin structure to create a strain on the channel;
    forming a first gate stack adjacent to the channel;

removing the hard mask and dummy fin;
forming a second gate stack over the channel; and
removing excess material from the second gate stack.

2. The method of claim 1 wherein:
the dummy fin comprises silicon; and
the epitaxially grown channel comprises silicon germanium; wherein:
    a lattice mismatch between silicon and silicon germanium causes the silicon germanium channel to have a compressive strain.

3. The method of claim 1 wherein:
the dummy fin comprises silicon germanium; and
the epitaxially grown channel comprises silicon; wherein:
    a lattice mismatch between silicon and silicon germanium causes the silicon channel to have a tensile strain.

4. The method of claim 1 wherein:
the hard mask comprises an oxide and a nitride.

5. The method of claim 1 wherein:
the first gate stack comprises a first high-k material which is below a first work function metal, which is below a first gate material.

6. The method of claim 5 wherein:
the second gate stack comprises a second high-k material which is below a second work function metal, which is below a second gate material.

7. The method of claim 5 wherein:
the first gate stack further comprises a bottom spacer below the first high-k material.

8. The method of claim 5 wherein the first gate material is selected from a polysilicon or a tungsten-based material.

9. The method of claim 1 wherein:
removing the hard mask and dummy fin comprises using a selective etch technique to remove the hard mask and dummy fin without affecting the channel.

10. The method of claim 1 further comprising:
placing a bottom spacer over the substrate prior to epitaxially growing the channel on the dummy fin structure.

* * * * *